(12) United States Patent
Bains et al.

(10) Patent No.: US 10,083,737 B2
(45) Date of Patent: *Sep. 25, 2018

(54) ROW HAMMER MONITORING BASED ON STORED ROW HAMMER THRESHOLD VALUE

(71) Applicant: Intel Corporation, Santa Clara, CA (US)

(72) Inventors: Kuljit S. Bains, Olympia, WA (US); John B. Halbert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/633,604

(22) Filed: Jun. 26, 2017

(65) Prior Publication Data

US 2017/0365324 A1    Dec. 21, 2017

Related U.S. Application Data

(63) Continuation of application No. 15/170,606, filed on Jun. 1, 2016, now Pat. No. 9,721,643, which is a (Continued)

(51) Int. Cl.
*G11C 11/4078* (2006.01)
*G06F 13/16* (2006.01)
(Continued)

(52) U.S. Cl.
CPC ...... *G11C 11/4078* (2013.01); *G06F 13/1636* (2013.01); *G11C 11/406* (2013.01); (Continued)

(58) Field of Classification Search
CPC .......................... G11C 11/406; G11C 11/401
See application file for complete search history.

(56) References Cited

U.S. PATENT DOCUMENTS 5,193,072 A    3/1993  Frenkil et al.
5,627,791 A    5/1997  Wright et al.
(Continued)

FOREIGN PATENT DOCUMENTS

CN    1697077 A    11/2005
CN    1702767 A    11/2005
(Continued)

OTHER PUBLICATIONS

CN Application No. 2013800280472, filed Jun. 26, 2013, First Office Action, dated Jun. 1, 2016, 7 pages.
(Continued)

*Primary Examiner* — Adam M Queler
*Assistant Examiner* — Edmund H Kwong
(74) *Attorney, Agent, or Firm* — Compass IP Law PC

(57) ABSTRACT

Detection logic of a memory subsystem obtains a threshold for a memory device that indicates a number of accesses within a time window that causes risk of data corruption on a physically adjacent row. The detection logic obtains the threshold from a register that stores configuration information for the memory device, and can be a register on the memory device itself and/or can be an entry of a configuration storage device of a memory module to which the memory device belongs. The detection logic determines whether a number of accesses to a row of the memory device exceeds the threshold. In response to detecting the number of accesses exceeds the threshold, the detection logic can generate a trigger to cause the memory device to perform a refresh targeted to a physically adjacent victim row.

20 Claims, 11 Drawing Sheets

Related U.S. Application Data continuation of application No. 14/108,830, filed on Dec. 17, 2013, now Pat. No. 9,384,821, which is a continuation-in-part of application No. 13/690,523, filed on Nov. 30, 2012, now Pat. No. 9,032,141.

(51) Int. Cl.
*G11C 11/406* (2006.01)
*G11C 11/408* (2006.01)
*G11C 29/50* (2006.01)
*G11C 29/04* (2006.01)

(52) U.S. Cl.
CPC ....... *G11C 11/408* (2013.01); *G11C 11/40611* (2013.01); *G11C 29/50* (2013.01); *G11C 29/50012* (2013.01); *G11C 2029/0409* (2013.01)

(56) References Cited

U.S. PATENT DOCUMENTS

| | | | |
|---|---|---|---|
| 5,920,501 | A | 7/1999 | Norman |
| 7,778,078 | B2 | 8/2010 | Nagadomi et al. |
| 8,432,769 | B2 | 4/2013 | Moon |
| 9,032,141 | B2 * | 5/2015 | Bains ............... G11C 11/4078 711/106 |
| 9,384,821 | B2 * | 7/2016 | Bains ............... G06F 13/1636 |
| 9,721,643 | B2 * | 8/2017 | Bains ............... G11C 11/4078 |
| 2003/0037185 | A1 | 2/2003 | Davis et al. |
| 2004/0221128 | A1 | 11/2004 | Beecroft et al. |
| 2006/0069855 | A1 | 3/2006 | Ha et al. |
| 2008/0181018 | A1 | 7/2008 | Nagadomi et al. |
| 2008/0259708 | A1 | 10/2008 | Tsukazaki et al. |
| 2009/0161467 | A1 | 6/2009 | Lin et al. |
| 2010/0034024 | A1 | 2/2010 | Mochizuki et al. |
| 2010/0106828 | A1 | 4/2010 | Palanki et al. |
| 2010/0110810 | A1 | 5/2010 | Kobayashi |
| 2010/0142304 | A1 | 6/2010 | Pyeon |
| 2010/0172200 | A1 | 7/2010 | Kawakubo et al. |
| 2010/0188914 | A1 | 7/2010 | Ahn et al. |
| 2010/0208537 | A1 | 8/2010 | Pelley et al. |
| 2011/0026353 | A1 | 2/2011 | Mokhlesi |
| 2011/0238941 | A1 | 9/2011 | Xu et al. |
| 2011/0283060 | A1 | 11/2011 | Ware et al. |
| 2012/0278533 | A1 | 11/2012 | Suzuki et al. |
| 2014/0006703 | A1 | 1/2014 | Bains et al. |
| 2014/0006704 | A1 | 1/2014 | Greenfield et al. |
| 2014/0019812 | A1 | 1/2014 | Saito |
| 2014/0156923 | A1 | 6/2014 | Bains et al. |
| 2014/0281206 | A1 | 9/2014 | Crawford et al. |
| 2015/0200002 | A1 | 7/2015 | Lin et al. |

FOREIGN PATENT DOCUMENTS

| | | |
|---|---|---|
| CN | 102067232 A | 5/2011 |
| CN | 102081964 A | 6/2011 |
| CN | 102592677 A | 7/2012 |
| JP | 20081992266 | 8/2008 |
| KR | 20050120344 | 12/2005 |
| WO | 2010085405 A1 | 7/2010 |
| WO | 2014004748 A1 | 1/2014 |

OTHER PUBLICATIONS

English Translation of State Intellectual Property Office, P.R. China, Office Action, Patent Application No. 201380057057.9, dated Jan. 4, 2017, 14 pages.

English Translation of State Intellectual Property Office, P.R. China, Search Report, Patent Application No. 201380057057.9, dated Jan. 4, 2017, 2 pages.

Extended European Search Report for Patent Application No. 13858832.2, dated Oct. 21, 2016, 30 pages.

International Preliminary Report on Patentability, PCT/US2013/048016, dated Jan. 8, 2015, 6 pages.

International Preliminary Report on Patentability, PCT/US2013/048634, dated Jun. 11, 2015, 7 pages.

International Search Report and Written Opinion for International Application No. PCT/US2013/048634, dated Oct. 18, 2013, 10 pp.

International Search Report and Written Opinion received for PCT Patent Application No. PCT/US2013/048016, dated Oct. 18, 2013, 9 pages.

UEDEC DDR4 Standard, Sep. 2012.

Notice of Preliminary Rejection, English Translation, KR Patent Application No. 10-2015-7009730, dated Apr. 12, 2016, 5 pages.

English Translation of State Intellectual Property Office, P.R. China, Second Office Action, Patent Application No. 201380057057.9, 7 pages.

International Search Report and Written Opinion for PCT Patent Application No. PCT/US2013/048634, dated Oct. 18, 2013, 10 pages.

Office Action for U.S. Appl. No. 13/690,523, dated Aug. 20, 2014, 10 pages.

Office Action for U.S. Appl. No. 14/108,830, dated Aug. 27, 2015, 8 pages.

Office Action for U.S. Appl. No. 15/170,606, dated Nov. 2, 2016, 9 pages.

* cited by examiner

COMMAND TRUTH TABLE 600

| FUNCTION | ABBR | CKE Prev Cycle | CKE Current Cycle | CS_n | ACT_n | RAS_n/A16 | CAS_n/A15 | WE_n/A14 | BG0-BG1 | BA0-BA1 | C2-C0 | A12/BC_n | A17, A13, A11 | A10/AP | A9-A9 |
|---|---|---|---|---|---|---|---|---|---|---|---|---|---|---|---|
| Mode Register Set | ABBR | H | H | L | H | L | L | L | BG | BA | V | OP CODE | | | |
| Refresh | REF | H | H | L | H | L | L | H | V | V | V | V | V | V | V |
| Self Refresh Entry | SRE | H | L | L | H | L | L | H | V | V | V | V | V | V | V |
| Self Refresh Exit | SRX | L | H | H | X | X | X | X | X | X | X | X | X | X | X |
| | | | | L | H | H | H | H | V | V | V | V | V | V | V |
| Single Bank Precharge | PRE | H | H | L | H | L | H | L | BG | BA | V | V | L | V | V |
| Precharge all Banks | PREA | H | H | L | H | L | H | L | V | V | V | V | V | H | V |
| RFU | RFU | H | H | L | H | L | H | H | RFU | | | | | | |
| Bank Activate | ACT | H | H | L | H | ROW ADDRESS | | | BG | BA | V | ROW ADDRESS | | | |
| Row Hammer | ACT_RH | H | H | L | L | ROW ADDRESS | | | BG | BA | V | ROW ADDRESS | | | |
| Write (Fixed BL4 or BL8) | WR | H | H | L | H | H | L | L | BG | BA | V | V | V | L | CA |
| Write (BL4, on the Fly) | WRS4 | H | H | L | H | H | L | L | BG | BA | V | L | V | L | CA |
| Write (BL8, on the Fly) | WRS8 | H | H | L | H | H | L | L | BG | BA | V | H | L | L | CA |
| Write with Auto Precharge (Fixed BL8 or BL4) | WRA | H | H | L | H | H | L | L | BG | BA | V | V | V | H | CA |
| Write with Auto Precharge (BL4, on the Fly) | WRAS4 | H | H | L | H | H | L | L | BG | BA | V | L | V | H | CA |
| Write with Auto Precharge (BL8, on the Fly) | WRAS8 | H | H | L | H | H | L | L | BG | BA | V | H | V | H | CA |
| Read (Fixed BL8 or BL4) | RD | H | H | L | H | H | L | H | BG | BA | V | V | V | L | CA |
| Read (BL4, on the Fly) | RDS4 | H | H | L | H | H | L | H | BG | BA | V | L | V | L | CA |
| Read (BL8, on the Fly) | RDS8 | H | H | L | H | H | L | H | BG | BA | V | H | L | L | CA |
| Read with Auto Precharge (Fixed BL8 or BL4) | RDA | H | H | L | H | H | L | H | BG | BA | V | V | V | H | CA |
| Read with Auto Precharge (BL4, on the Fly) | RDAS4 | H | H | L | H | H | L | H | BG | BA | V | L | V | H | CA |
| Read with Auto Precharge (BL8, on the Fly) | RDAS8 | H | H | L | H | H | L | H | BG | BA | V | H | V | H | CA |
| No Operation | NOP | H | H | L | H | H | H | H | V | V | V | V | V | V | V |
| Device Deselected | DES | H | H | H | X | X | X | X | X | X | X | X | X | X | X |
| Power Down Entry | PDE | H | L | H | V | X | X | X | X | X | X | X | X | X | X |
| Power Down Exit | PDX | L | H | H | X | X | X | X | X | X | X | X | X | X | X |
| ZQ Calibration Long | ZQCL | H | H | L | H | H | H | L | V | V | V | V | V | H | V |
| ZQ Calibration Short | ZQCS | H | H | L | H | H | H | L | V | V | V | V | V | L | V |

FIG. 6

| A7 | A6 | A5 | A4 | A3 | A2 | A1 | A0 |
|---|---|---|---|---|---|---|---|
| Don't Care | Don't Care | Don't Care | Don't Care | tMAC | tMAC | tMAC | tMAC |

FIG. 9

|  | A7:A3 | A2 | A1 | A0 | NOTE |
|---|---|---|---|---|---|
| Reserved | x | 1 | 1 | 1 |  |
| Reserved | x | 1 | 1 | 0 |  |
| tMAC>300K | x | 1 | 0 | 1 |  |
| tMAC>400K | x | 1 | 0 | 0 |  |
| tMAC>500K | x | 0 | 1 | 1 |  |
| tMAC>600K | x | 0 | 1 | 0 |  |
| tMAC>700K | x | 0 | 0 | 1 |  |
| Unknown | x | 0 | 0 | 0 | 1 |

FIG. 10

ROW HAMMER MONITORING BASED ON STORED ROW HAMMER THRESHOLD VALUE

RELATED CASES

The present application is a continuation of a U.S. patent application Ser. No. 15/170,606, filed Jun. 1, 2016, which in turn is a continuation of a U.S. patent application Ser. No. 14/108,830, filed Dec. 17, 2013, which in turn is a continuation-in-part of U.S. patent application Ser. No. 13/690,523, filed Nov. 30, 2012. The present application claims the benefit of priority of the earlier-filed applications.

FIELD

Embodiments of the invention are generally related to memory management, and more particularly to monitoring row hammer events based on a stored, programmed value.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2012, Intel Corporation, All Rights Reserved.

BACKGROUND

With advances in computing technology, computing devices are smaller and have much more processing power. Additionally, they include more and more storage and memory to meet the needs of the programming and computing performed on the devices. The shrinking size of the devices together with the increased storage capacity is achieved by providing devices with higher density, where there are more and more atomic storage units within a memory device, but each has smaller and smaller geometries.

Within the latest generation of increased density devices, intermittent failure has appeared in some devices. For example, some existing DDR3 (dual data-rate, version 3) based systems experience intermittent failures with heavy workloads. Researchers have traced the failures to repeated access to a single row of memory within the refresh window of the memory cell. For example, for a 32 nm process, if a row is accessed 550K times or more in the 64 ms refresh window, a physically adjacent wordline to the accessed row has a high probability of experiencing data corruption. The condition has been referred to as "row hammer" or "single row disturb" in the DRAM (dynamic random access memory) industry, where the condition is most frequently observed, and will be used to describe the condition generally herein. The row hammering can cause migration across the passgate. The leakage and parasitic currents caused by the repeated access to one row cause data corruption in a non-accessed physically adjacent row.

However, those skilled in the art also understand that memory devices vary among different generations of devices, among different manufacturers of comparable devices, and even among different batches within the same manufacturer. Thus, while heavy workloads have been observed to cause intermittent failures, there is no clear definition of "heavy workload" that applies to all devices. Thus, the row hammering condition is not clearly defined as a general parameter that applies to all devices.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 6 is an embodiment of a command truth table supporting a targeted refresh command.

FIG. 9 is a table of mode register entries for maximum activate count (tMAC) according to an embodiment.

FIG. 10 is a table of mode register entries for tMAC decode vales according to an embodiment.

Figure 1A:
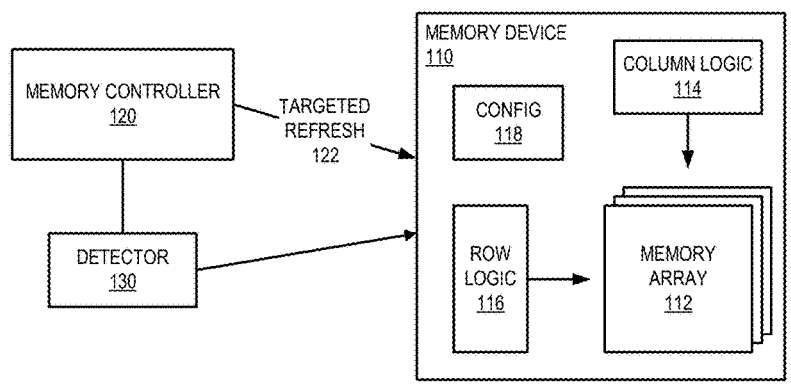
FIG. 1A is a block diagram of an embodiment of a system that monitors for a row hammer condition using a programmable row hammer threshold.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a memory device includes detection logic that monitors for a row hammer event. The detection logic obtains a threshold that indicates a number of accesses for a memory device that indicates a number of accesses within a time window that causes risk of data corruption on a physically adjacent row. The detection logic obtains the logic threshold from a register that stores configuration information for the memory device, and can be a register on the memory device itself and/or can be an entry of a configuration storage device of a memory module to which the memory device belongs. The detection logic determines whether a number of accesses to a row of the memory device exceeds the threshold. In response to detecting the number of accesses exceeds the threshold, the detection logic can generate a trigger to cause the memory device to perform a refresh targeted to a physically adjacent victim row.

One approach previously identified to deal with failure due to row hammer is to limit the number of accesses allowed per row per refresh cycle, which has performance impacts in the system. Another approach identified to address row hammer failure includes decreasing the bottom critical dimension (BCD) in the buried channel array transistor (BCAT), and/or increasing channel length to improve the drain induced barrier lowering (DIBL). However, changing the dimension sizes of the devices has both physical and practical limitations. To the extent certain dimensions may now be changed, it would still require changes to the manufacturing processes. Also, it leaves open the question of how to address the issue in next-generation products.

Another approach to dealing with the row hammer issue is to decrease the time between refreshes. However, the refresh time has already been held constant even as the density of the devices has increased. Current devices are required to perform refresh on larger and larger areas in the same period of time. Thus, further decreasing the refresh time would cause a performance impact in the system, such as by requiring additional refresh overhead in the memory devices.

While these currently proposed approaches for dealing with row hammering have negative performance impacts, it is not even clear what processing changes would need to be made, or how much refresh time would need to be changed to generally resolve row hammering. Memory controller manufacturers and memory device manufacturers are generally not the same entity. Most memory controller manufacturers would like to make controllers that can interface with memory devices from different device manufacturers. However, currently proposed approaches would fix a memory controller to a specific batch of memory devices from a single manufacturer, or else would still risk row hammering.

Instead of making design changes or changes to operating parameters of the memory devices, the system as described herein can provide an active runtime mechanism to monitor and address row hammer events. The monitoring can be actively performed in accordance with a programmed configuration value or other threshold value stored in a memory device and/or stored on a memory module that includes multiple memory devices. In one embodiment, the memory controller monitors each access to a memory device to determine if the number of accesses to any row causes a row hammer condition. Alternatively, monitoring logic can be distributed to a memory device and/or memory module. Wherever the monitoring mechanism is located, it performs monitoring in accordance with a stored threshold value obtained from a storage location. When a row hammer condition is detected based on the obtained threshold value, the detection logic can trigger a row hammer refresh or targeted refresh, as described in more detail below.

The storing of the row hammer threshold recognizes the fact that row hammer limits will vary across memory device suppliers, and also across different batches within the same supplier or manufacturer. Additionally, memory devices have historically moved to new process technology which increases the density of the memory devices. There is no reason to believe that trend will stop in the near future. Seeing that the row hammer condition is a memory density issue, the move to new process technology will also change the row hammer limit or threshold of memory devices. It is common to replace memory devices with newer devices, which for any of the reasons above can have a different row hammer event threshold. Storing the threshold and using that in the monitoring enables a memory subsystem to track row hammering specific to the devices present in the memory subsystem.

Thus, memory controllers can track the number of accesses to the rows (tracking row hammering) and issue a command to the memory devices to refresh targeted adjacent rows. In one embodiment, the threshold information is stored in a register on the memory device (e.g., DRAM) itself. Such information can be fused by the manufacturer or a device tester, for example. In one embodiment, the value is stored as a field in a configuration register, which is written to the specific memory device, or written to a memory module (e.g., a DIMM (dual inline memory module) after determining its characteristics.

It will be understood that the storing of the information can be performed in any of a number of different ways. In one embodiment, the information is encoded in the device and/or memory module. For example, a three-bit code can be used to provide threshold limits. The encoding can be established any way agreed upon by memory controller suppliers, memory device suppliers, a different, third party, or some combination. Examples follow of different ways the encoding could be configured. Encoding Example 1: 000—no limit; 001—500K; 010—400K; 011—300K; 100—250K; 101—200K; 110—150K; 111—100K. Example 2: 000—100K or not defined; 001—150K; 010—200K; 011—250K; 100—300K; 101—400K; 110—450K+; 111—unknown RH limit. Those of skill in the art will understand there are practically innumerable variations on the specific values used in these examples. Thus, these examples are meant to illustrate encoding, but are not to be understood as limiting.

The examples provided herein primarily discuss the row hammer issue with respect to DRAM. However, it will be understood that the row hammer issue is more generally a memory device scaling issue, which occurs as memory densities increase. Thus, the descriptions with respect to DRAM will be understood as non-limiting examples that can be applied to other memory technologies that include memory controller or equivalent logic. The targeted refresh command described herein is compatible with any of a number of memory technologies, such as DDR4 (dual data rate version 4, specification in development as of the filing of this application), LPDDR4 (low power dual data rate version 4, specification in development as of the filing of this application), or WIDEIO (specification in development as of the filing of this application). The storing of row hammer condition limit information is likewise compatible with any memory technology where the memory device can store configuration information on itself, and/or where a memory module stores configuration information.

FIG. 1A is a block diagram of an embodiment of a system that monitors for a row hammer condition using a programmable row hammer threshold. In one embodiment, the use of a stored threshold can be referred to as a programmable row hammer threshold. System 100 includes memory device 110 coupled to memory controller 120. Memory device 110 can include any type of memory technology that has adjacent rows of memory cells, where data is accessible via a wordline or the equivalent. In one embodiment, memory device 110 includes dynamic random access memory (DRAM) technology. In one embodiment of the invention, the memory device includes but is not limited to, a Synchronous Dynamic Random Access Memory (SDRAM), Dynamic Random Access Memory (DRAM), RAMBUS Dynamic Random Access Memory (RDRAM), double-data-rate three SDRAM (DDR3), DDR four SDRAM (DDR4), SDRAM LPDDR4 and any other type of random access memory device.

Memory device 110 includes memory array 112, which represents one or more logical and/or physical groups of memory (which can include ranks, banks, and/or other groupings). While not specifically shown in system 100, memory array 112 can include one or more rows that are the targets of repeated access within a time window. Such a row is subject to a row hammer condition. In many modern memory devices, the architecture of the semiconductor layout causes one or more physically adjacent rows to be at risk of becoming corrupted. The row or rows at risk of becoming corrupted due to row hammer condition are referred to herein as victim rows.

Memory device 110 includes column logic 114 and row logic 116, which are used to decode an access instruction to the proper memory location within memory array(s) 112. There is no requirement for the number of rows and columns to be equal, and in fact they are typically not equal. Memory controller 120 sends commands or instructions to memory device 110 over a command bus (e.g., a command/address (C/A) bus), which are then interpreted by memory device 110. Memory device 110 decodes the command information to perform a variety of access functions within the memory, and decodes address information via column logic 114 and row logic 116. The logic accesses a specific location in memory with a combination of a column address strobe or signal (CAS) and a row address strobe or signal (RAS). Rows of memory can be implemented in accordance with known memory architectures or their derivatives. Briefly, a row of memory includes one or more addressable columns of memory cells, as identified by the CAS generated by column logic 114. The rows are addressable via the RAS generated by row logic 116.

In one embodiment, memory device include configuration 118. In one embodiment, configuration 118 is stored within memory device 118. Alternatively, configuration 118 represents configuration associated with memory device 110, which is stored somewhere other than in memory device 110. Configuration 118 can be stored in a register device or other storage device within the memory device.

System 100 includes detector 130, which represents hardware and/or software or other logic that enables system 100 to detect a row hammer event or row hammer condition. There can be multiple different mechanisms used to detect the row hammer condition. System 100 detects a row hammer condition via detector 130, which in one embodiment includes a table or log to monitor accesses to selected rows of memory. Thus, detector 130 can determine when a row of memory array 112 experiences repeated accesses within a threshold time period. Detector 130 can include hardware and/or logic at memory device 110, memory controller 120, and/or separate from either the memory device or the memory controller.

Detector 130 determines a number of times a row is accessed within a time period. Detector accesses or otherwise obtains row hammer threshold information from configuration 118. A row hammer event is not simply about how many times a row is accessed, but how many times in a given time period. Once a row is refreshed, the conditions that could cause data corruption are overcome. Thus, the time period for the monitoring can be based at least in part on the refresh rate. In one embodiment, the time period during for which detector 130 monitors for a threshold number of accesses is equal to the refresh cycle time of memory device 110. The number of accesses during the time period is determined from configuration 118.

In one embodiment, memory controller 120 generates targeted refresh command 122 to cause the memory controller to perform a targeted refresh in response to detecting a row hammer event. Targeted refresh command 122 is a refresh command that occurs "off-schedule," meaning that the command is sent in response to detecting the row hammer event as opposed to sending the command because a timer indicates it is time to perform a refresh. In one embodiment, memory controller 120 doubles up an existing command to send a targeted refresh command. For example, targeted refresh command 122 could be doubled up with either an Activate or a Refresh command as defined for DRAM (dynamic random access memory). The memory controller can accomplish the doubling up, for example, by use of another pin and/or a Mode Register state that can cause the memory device to interpret a command as a targeted refresh instead of the Activate or (standard) Refresh commands. Memory controller 120 provides address information to indicate the hammered row. Detector 130 can indicate address information identifying the row, which memory controller 120 can indicate to memory device 110 to cause the memory device to determine what victim row(s) should be refreshed. The address can be indicated to the memory device specifically, or can be provided more generally. Thus, when detector 130 determines that a specific row of memory is subject to a row hammer condition (accesses have reached or exceeded a threshold), it indicates the row to memory controller 120, which in turn can send a targeted refresh command.

When referring to targeted refresh command 122, it will be understood that different memory device manufacturers use different logic and architectures to utilize the memory resources of the devices. For example, different memory device manufacturers can use different offsets to map between logical memory addresses used in the host processor (not shown) and the physical memory addresses used internally to memory device 110. In one embodiment, memory controller 120 utilizes the same logical memory addresses as used by the host processor. Thus, in one embodiment, memory controller 120 provides a row address to memory device 110 indicating the hammered row. The memory controller can indicate the row address in conjunction with and/or as part of a command that it issues to memory device 110. The memory device can then compute the specific address or addresses of any victim row(s). Memory device 110 then performs a targeted refresh on the physically adjacent, victim row(s).

In one embodiment, detector 130 includes configuration to set the timeframe for which it is to monitor for a row hammer condition, as well as configuration to set the number of accesses that define a row hammer event that would cause the memory controller to trigger a targeted refresh, based on information obtained for the specific memory devices. Detector 130 maintains data for a subset of the total number of rows in system 100. In one embodiment, detector 130 maintains data for a number of rows based on MVC, which is the maximum victim count expected for the configured timeframe. For example, detector 130 can keep a table with MVC+1 entries, or more entries. Detector 130 can then roll entries into the table for memory locations that are accessed, rolling out the lowest-count entries in the table to replace them.

It will be understood that the described threshold could also be described as an access rate threshold referring to the rate of access to the memory rows that causes the row hammer condition, a row hammer threshold referring to the threshold at which a row hammer condition can be detected to exist, or a row hammer limit referring to a limit to a number of accesses within a window that represents a point at which the risk of data corruption exists. Other expressions could also be used referring to the fact that a number of accesses detected within a time window can be addressed by the system to avoid data corruption.

Figure 1B:
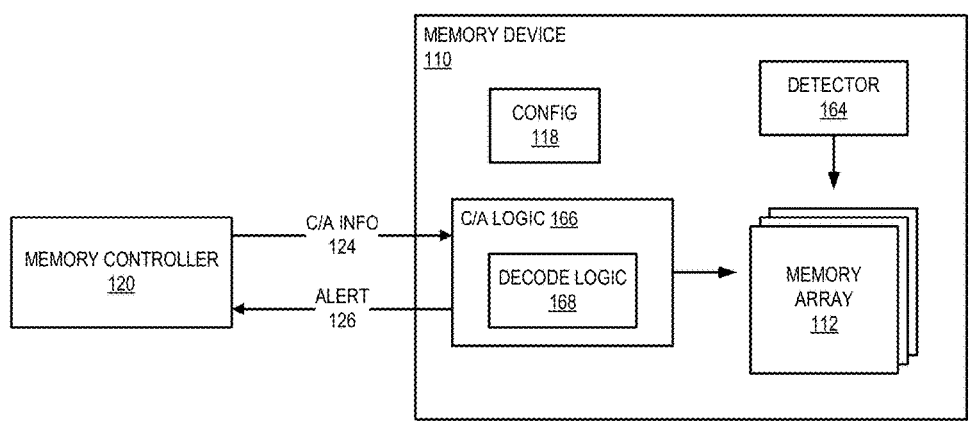
FIG. 1B is a block diagram of an embodiment of a system that includes column/address information logic and distributed detection logic at a memory device to indicate a detected row hammer event in accordance with a programmable row hammer threshold.

FIG. 1B is a block diagram of an embodiment of a system that includes column/address information logic and distributed detection logic at a memory device to indicate a detected row hammer event in accordance with a programmable row hammer threshold. System 150 is a system that includes a memory device or memory subsystem and a memory controller in accordance with any embodiment described herein. System 150 includes memory device 110 coupled to memory controller 120. Memory device 110 can include any type of memory technology that has adjacent rows of memory cells, where data is accessible via a wordline or the equivalent.

Memory device 110 includes memory array 112, which represents one or more logical and/or physical groups of memory. In one embodiment, memory device 110 includes C/A logic 166, which is used to decode access instructions to specific memory location(s) within memory array 112. C/A logic 166 includes decode logic 168 such as column logic and row logic, which activate memory locations for reading and/or writing. C/A logic 166 can be implemented as a C/A register (e.g., of an RDIMM or LRDIMM device), as a C/A buffer or other logic buffer (e.g., in a 3DS (three-dimensional stacking) configuration or buffer-on-boards implementation), or other logic device. In one embodiment, C/A logic 166 is implemented as a logic buffer in a three-dimensional stacked memory device, such as a hybrid memory cube (HMC), where DRAM devices are stacked on top of the logic buffer.

Memory controller 120 sends commands or instructions (C/A info 124) to memory device 110 over a command bus (e.g., a command/address (C/A) bus), which are then interpreted by memory device 110. Memory device 110 decodes the command information to perform a variety of access functions within the memory, and decodes address information via decode logic 168. The logic accesses a specific location in memory with a combination of a column address strobe or signal (CAS) and a row address strobe or signal (RAS). Rows of memory can be implemented in accordance with known memory architectures or their derivatives. Briefly, a row of memory includes one or more addressable columns of memory cells, as identified by the CAS. The rows are addressable via the RAS.

In one embodiment, memory device 110 includes detector 164, which represents hardware and/or software or other logic that enables memory device 110 to detect a row hammer event or row hammer condition. In one embodiment, detector 164 is included within C/A logic 166. In either cases detector 164 can be said to be distributed in that it includes logic at memory device 110 to monitor for row hammer conditions. Row hammer event detection can be performed by array, device, rank, or other separation of the memory resources.

There can be multiple different mechanisms used to detect the row hammer condition. Detector 164 can include a table or log to monitor accesses to selected rows of memory. When memory device 110 includes detector logic, detector 164 can monitor for row hammer conditions based on threshold information stored in configuration 118. When a row hammer event or row hammer condition is detected, in one embodiment, C/A logic 166 generates alert signal 126 to indicate the condition to memory controller 120. In response to the alert, memory controller 120 triggers a targeted refresh in response to detecting a row hammer event, in accordance with any embodiment described herein.

Figure 2:
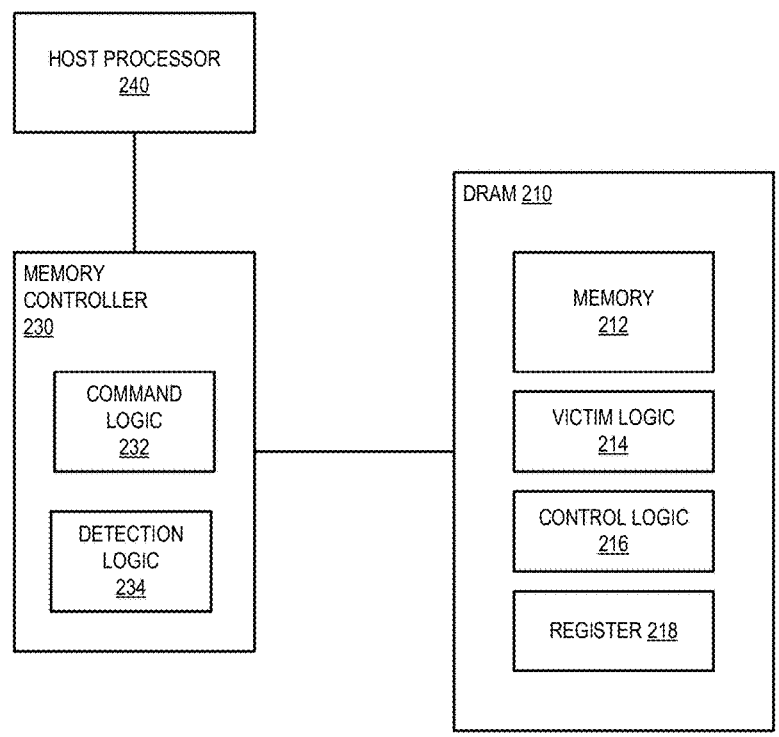
FIG. 2 is a block diagram of an embodiment of a system including row hammer detection logic, and victim logic at a memory device.

FIG. 2 is a block diagram of an embodiment of a system including row hammer detection logic, and victim logic at a memory device. System 200 can be one example of a memory subsystem in accordance with any embodiment described herein. System 200 illustrates one logical understanding of a memory subsystem. DRAM 210 includes rows of memory in memory 212, which are rows of memory in accordance with known memory architectures or their derivatives. Briefly, a row of memory includes one or more addressable columns of memory cells. In one embodiment, DRAM 210 map logical address information from memory controller 230 to physical memory locations in memory 212.

It is understood that memory is typically accessed in such a way that "adjacent" memory addresses provided by memory controller 230 (typically logical addresses) do not necessarily map to physically adjacent memory locations in DRAM 210. Rather, each adjacent memory address as provided by memory controller 230 maps to addresses that are located as some consistent offset. Some memory devices scramble the address, thus resulting in victim rows that are identified at the memory device itself by descrambling the address information. For example, addresses 0xX0h, 0xX1h, and 0xX2h could be located at physical locations 0xY0h, 0xY3h, and 0xY7h, respectively, where the offset is '4'. In the example, 'X' represents the higher bit information of the addresses as provided by the memory controller, and 'Y' represents the higher bit information of the addresses as mapped within DRAM 210. Thus, the memory device itself can determine the victim row based on the configuration of the device in conjunction with the address information provided by the memory controller with a targeted refresh command.

Host processor 240 can be any type of processing unit, processor, central processing unit (CPU), graphics processing unit (GPU), microcontroller, or other processing device. Host processor 240 generally accesses DRAM 210 and other memory devices via memory controller 230. In one embodiment, memory controller 230 is part of host processor 240 or a processor package of host processor 240. In an alternate embodiment, memory controller 230 is part of a supporting "chipset" or hardware logic that provides an infrastructure for power and interface logic for a hardware platform of which host processor 240 is a part. In one embodiment, DRAM 210 is a volatile memory, or a memory device whose contents are non-deterministic if power is interrupted to the device. Thus, a volatile memory requires a regular power source to allow it to refresh the memory cells to keep the data from become lost or corrupted. As mentioned above, detection logic 234 enables system 200 to identify a row hammer condition to be able to respond to the row hammer condition with a targeted refresh.

DRAM 210 includes victim logic 214, which represents logic to determine what row or rows are at risk of corruption due to the row hammer condition. In one embodiment, victim logic 214 can be at least partially executed at memory controller 230. However, for the sake of broader interoperability between memory controller 230 and other types of memory devices, victim logic 214 generally resides at DRAM 210. Thus, memory controller 230 need only provide a targeted refresh trigger to DRAM 210 to cause a targeted refresh. DRAM 210 can use a map or other logic to determine what row or rows are potential victims.

DRAM 210 includes control logic 216, which includes logic to perform refresh of memory 212. Each memory device includes some logic to keep track of what memory cells have been refreshed, and what rows are next due for a refresh. Control logic 216 can implement the actual targeted refresh based on receiving a targeted refresh command.

DRAM 210 can include one or more registers 218, which allow for configuration of DRAM 210 and/or communication between DRAM 210 and memory controller 230. In one embodiment, a register 218 stores threshold information that indicates a number of accesses that represent a row hammer condition. Memory controller 230 includes command logic 232. Command logic 232 enables memory controller 230 to read and/or write registers 218. In one embodiment, memory controller 230 triggers a targeted refresh by setting a value in a register 218 of DRAM 210 to cause the memory device to perform the targeted refresh. In one embodiment, memory controller 230 triggers the targeted refresh in response to detecting that a number of accesses to a row exceeds a threshold read from register 218. Detection logic 234 represents logic in accordance with any embodiment described herein that enables memory controller 230 to determine that the number of accesses to a row exceeds the threshold read from register 218.

Figure 3A:
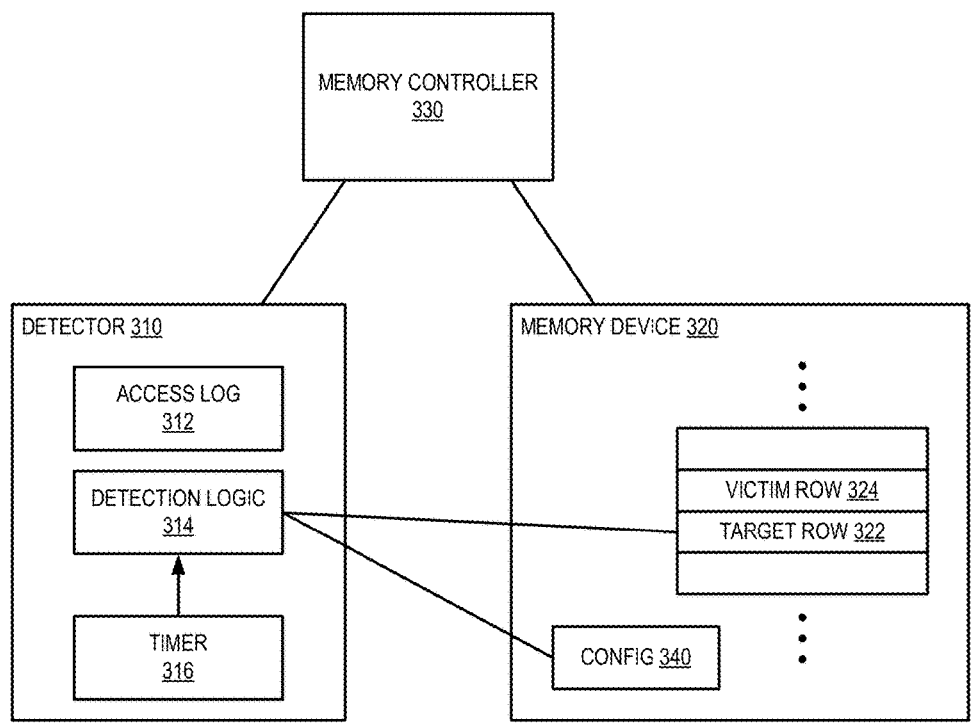
FIG. 3A is a block diagram of an embodiment of a system that monitors for a row hammer condition in accordance with a threshold from a configuration storage of the memory device.

FIG. 3A is a block diagram of an embodiment of a system that monitors for a row hammer condition in accordance with a threshold from a configuration storage of the memory device. System 302 represents an example of a system that includes a memory subsystem with memory controller 330, memory device 320, and detector 310. System 302 provides one example of a system in accordance with systems 100, 150, or 200 described above. In one embodiment, detector 310 is part of memory controller 330. Memory controller 330 can issue a targeted refresh command in response to detection of a row hammer condition by detector 310.

Memory device 320 includes multiple rows of memory. Among the rows is target row 322, which is a row that is the target of repeated access within a time period. Victim row 324 is a row that is at risk of data corruption due to the hammering of target row 322. There can be more than one victim row associated with a hammered row (e.g., each row physically adjacent to the hammered row). In one embodiment, memory device 320 includes configuration 340 that indicates a specific value determined for the memory device to represent a row hammer or access rate threshold. The row hammer threshold can be determined by a manufacturer.

In one embodiment, detector 310 includes access log 312. Access log 312 can be implemented as a list or array or table or other logical structure that stores entries having multiple fields of information. Each entry includes at least an address or identifier for a specific row of memory and an access count for the entry. The number of entries in access log 312 is much smaller than the total number of rows in memory device 320. Thus, detector 310 can monitor by keeping a count for a subset of all rows. The count of each row can be incremented as the row is accessed again, and the count can be compared to the threshold to determine if the row has been accessed the threshold number of times.

Detection logic 314 includes logic to enable detector 310 to determine that an access command is directed to a row of memory. While detection logic 314 is shown specifically with a line to target row 322, detection logic 314 can monitor accesses to any row in accordance with the row hammer threshold set out in configuration or configuration information 340. In one embodiment, detection logic 314 includes a mechanism to determine an address of an Activate command issued by memory controller 330. Thus, every time memory controller 330 sends a command for memory device 320 to activate a row of memory, detector 310 can identify the address associated with the command, and keep track of access for the address in access log 312.

Detector 310 determines when access to a row exceeds a threshold, and indicates the row address information to the memory controller. It will be understood that the address information in access log 312 is not necessarily the same address used by memory device 320 to access the physical memory resources. Memory device 320 decodes the addresses sent by memory controller 330 to physical resources. Thus, when detector 310 identifies a row for which accesses have reach or exceeded the threshold, the information may still need to be decoded to identify physical resources of target row 322 so that physically adjacent victim row 324 can be identified.

Detector 310 receives timer information 316, through which detector 310 can identify the start of a timeframe or time period or time window, as well as the end of a timeframe. The monitoring takes place between the beginning and end of the timeframe. In one embodiment, the timeframe goes from one scheduled refresh to the next.

In one embodiment, detector 310 clears the count of an entry in access log 312 when the count of the entry reaches the threshold and is identified to the memory controller. It will be understood that detection can be performed on a rank and/or bank granularity. There is not necessarily a single detector 310 for the memory controller. Each bank can be tracked, and each memory channel can have monitoring.

Figure 3B:
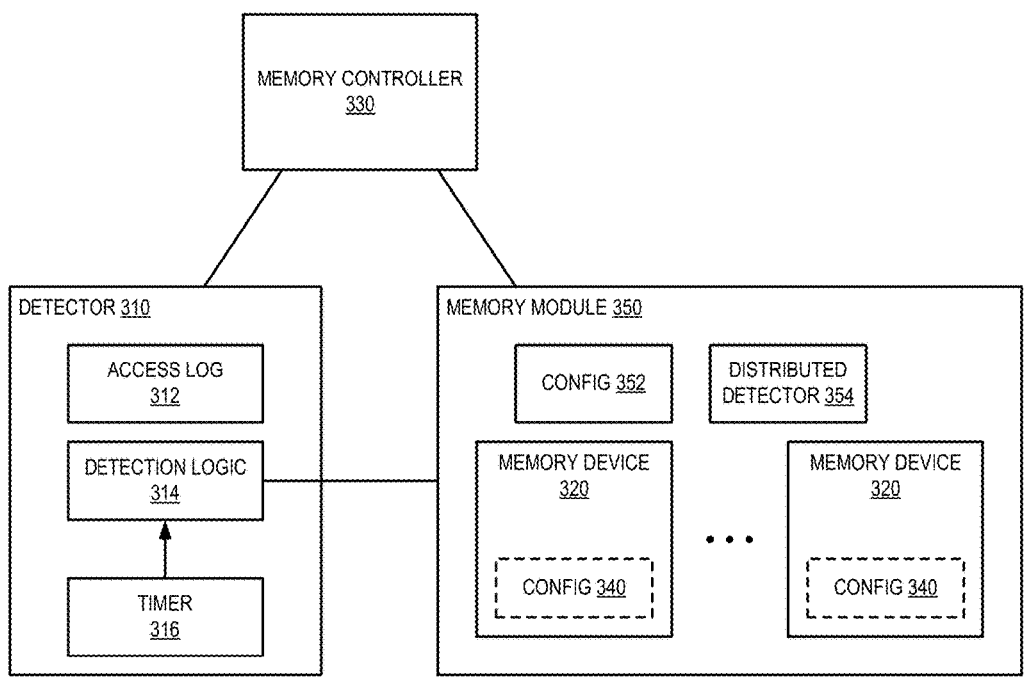
FIG. 3B is a block diagram of an embodiment of a system that monitors for a row hammer condition in accordance with a threshold from a configuration storage of a memory module.

FIG. 3B is a block diagram of an embodiment of a system that monitors for a row hammer condition in accordance with a threshold from a configuration storage of a memory module. System 304 illustrates one example of an embodiment of system 302 or any other memory subsystem described herein. Whereas system 302 illustrated a single memory device 320, system 304 illustrates memory module 350, which includes multiple memory devices 320. In some systems, a memory device is disposed directly onto a motherboard or primary circuit board of a host device. System 302 represents a memory subsystem where memory device 320 is placed directly on a host system board. System 304 represents the use of a module board that typically connects to a host system board via a connector. The descriptions with respect to memory controller 330, detector 310, access log 312, detection logic 314, and timer 316 in system 302 apply equally well to system 304.

Memory module 350 includes multiple memory devices 320, and a distributed detector 354 can be included on memory module 350. In one embodiment, memory module 350 includes a configuration device, represented by configuration 352. In one embodiment, configuration or configuration information 352 is included in a serial presence detect (SPD) device, which is commonly used on DIMMs, or comparable module device.

Typically the SPD is a small serial EEPROM (electronically erasable programmable read only memory) or flash device mounted on the memory module which contains data related to size, speed, architecture details, and/or other manufacturing data. Generally a memory manufacturer or tester or other subcontractor programs the SPD during the manufacturing/verification process. Memory controller 330 and/or detector 310 can read the data from configuration 352. Thus, a memory supplier can program information for the entire group of memory devices 320 on memory module 350.

In one embodiment, each memory device 320 includes configuration or configuration information 340 in addition to memory module 350 storing configuration 352. It is possible to have variation in different devices, where one device operates according to one threshold, and another to another threshold. The SPD can have a worst-case value saved to it, and each device (e.g., in an MPR) can store a device-specific value, for example. The memory controller can track module by module (e.g., DIMM by DIMM), or by lowest threshold.

It will be understood that one or more memory device 320 on memory module 350 could have different threshold values. In one embodiment, detector 310 monitors for row hammer conditions based on individual configuration information 340 from configuration registers of individual memory devices 320. Such an embodiment can include implementations where configuration 352 exists for the memory module. Alternatively, detector 310 can monitor based on configuration 352 despite each memory device 320 including individual configuration 340. In one embodiment, detector 310 monitors based on individual configuration 340 unless there is a conflict (i.e., different threshold values), in which case it will monitor based on configuration 352.

In one embodiment, threshold configuration 352 on memory module 350 stores the most restrictive threshold, or the lower threshold, of any memory device 320. Memory module 350 can include logic to make such a determination and store the value. Alternatively, memory controller 330 could read threshold from configuration devices of each memory device 320 and write the threshold information into configuration 352. In one embodiment, the row hammer threshold information is simply one field of configuration 352 and/or of configuration information 340. In one embodiment, configuration 340 is stored in Page 3 of a multi-purpose register (MPR) or each storage device 320, which can be used for vendor-specific information. Thus, different thresholds due to different lots, processes, suppliers of memory devices 320 can be effectively tracked in systems 302 and 304.

Figure 4:
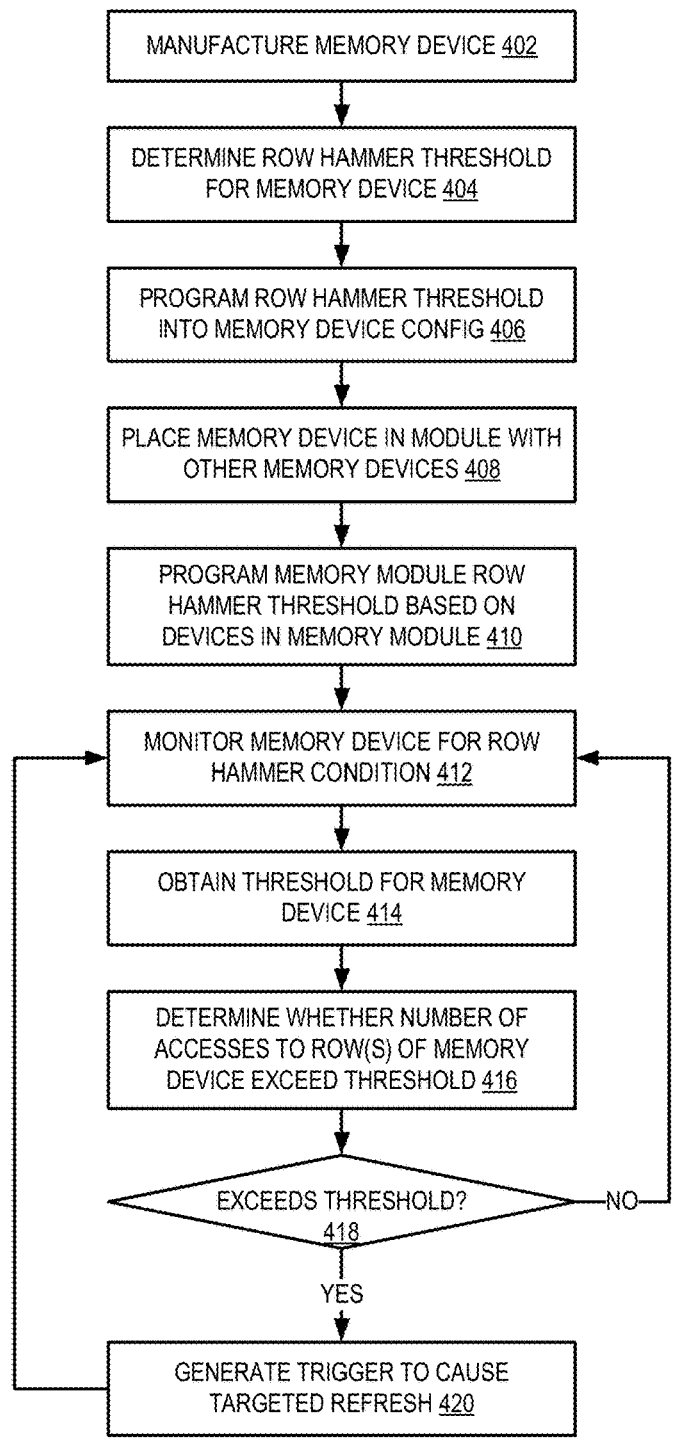
FIG. 4 is a flow diagram of an embodiment of a process for detecting a row hammer condition in accordance with a programmable row hammer threshold.

FIG. 4 is a flow diagram of an embodiment of a process for detecting a row hammer condition in accordance with a programmable row hammer threshold. A supplier manufactures a memory device, 402. A memory device in this context can refer to a discrete memory die in its packaging (e.g., a memory "chip"). The supplier or another party that receives the manufactured memory chip determines a row hammer threshold for the memory device, 404. The determining can include making a determination based on knowledge of the processes used and conditions existent during manufacture of the memory device, and/or through the performing of one or more tests on the device.

The supplier or other party can program the row hammer threshold into a memory device configuration register, 406. The threshold is not necessarily placed on the memory device itself. In one embodiment, the memory device is placed on a module with other memory devices, 408. When used in a memory module, different memory devices can be placed on the module at different times. Similarly, different memory modules can be placed at separate times on a memory bus of a host computer system. In either case, there could be a mismatch of threshold among memory devices and/or among memory modules. In one embodiment, row hammer conditions are monitored on a device-by-device basis based on their own threshold information. In one embodiment, different memory modules are monitored based on different thresholds. In one embodiment, all memory devices in a system are monitored in accordance with a single threshold value, which then is typically set to be the lowest threshold of any device in the memory subsystem.

Thus, either a memory supplier or a memory module supplier can program a memory module row hammer threshold based on the devices in the memory module, 410. In one embodiment, a host system (e.g., via the memory controller or other logic), detects and programs the memory module row hammer threshold. In one embodiment, the memory module self-discovers its row hammer threshold.

In an active system with the memory device and/or memory module, detection logic monitors the memory device for a row hammer condition as defined by a row hammer threshold associated with or applicable to the memory device, 412. A threshold is associated with or applicable to a memory device if it is stored on the device itself, or on a memory module of which it is a part, or otherwise obtained and used by the detection logic to monitor it. Thus, the detection logic obtains the threshold for the memory device, 414, and determines whether the number of accesses to row(s) of the memory device exceed the threshold, 416.

If the threshold is exceeded, 418 NO branch, the detection logic continues to monitor for a row hammer condition, 412. If the threshold is exceeded, 418 YES branch, the detection logic generates a trigger to cause a targeted refresh of the memory device, 420. The trigger can be in accordance with any embodiment described herein.

Figure 5:
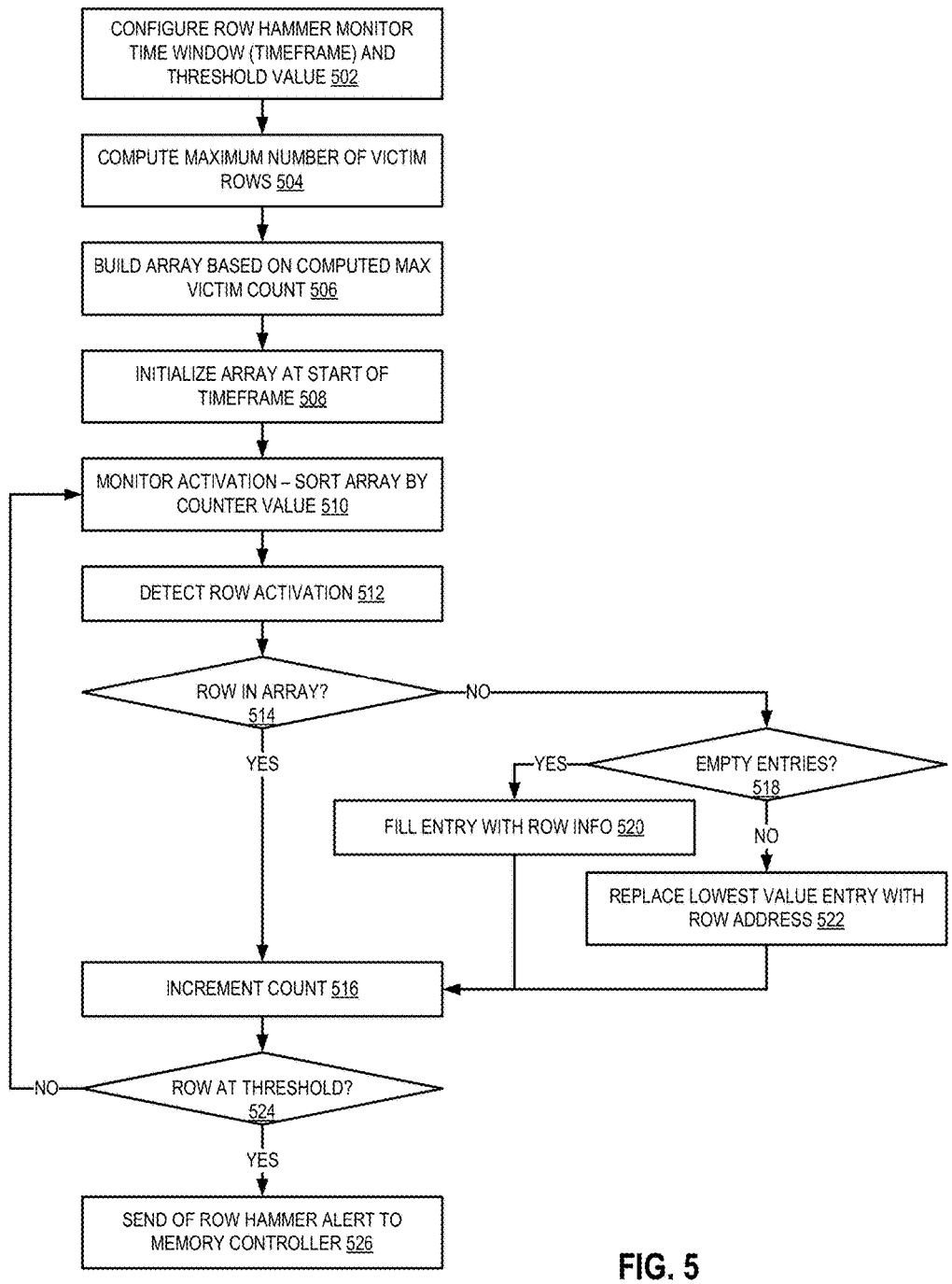
FIG. 5 is a flow diagram of an embodiment of a process for monitoring a row hammer condition of a memory device.

FIG. 5 is a flow diagram of an embodiment of a process for monitoring a row hammer condition of a memory device. The memory device and distributed detection logic can use any mechanism to monitor for row hammer conditions that would indicate when accesses to a row of memory have increased the likelihood of corruption in a victim row beyond what is configured as an acceptable level. Some mechanisms can include keeping a count for only a subset of all rows, instead of keeping a count for all rows. Some mechanisms maintain a table, which could include an ordered table of accesses. Some mechanisms can be based on a computed maximum victim count (MVC). One implementation is described as follows.

An administrator can configure a memory subsystem with a row hammer monitor time window or timeframe, and a threshold value of accesses that indicates a row hammer condition, 502. The administrator can pre-configure the system to receive inputs that indicate the timeframe and threshold values. In one embodiment, the configuring is part of setting register values or configuration in firmware for the memory subsystem. The system includes a detector or detection logic configured to perform monitoring for the timeframe, monitoring for the threshold number of accesses. Additionally, as described herein, the specific threshold value is obtained for a memory device or group of memory devices (e.g., a module).

Thus, the timeframe and number of accesses are defined in the system. In one embodiment, the timeframe is 64 milliseconds. The number of accesses that make up the threshold depend on the architecture of the memory device to which the memory controller is connected, including the size of the memory and the density of the memory (e.g., the minimum process feature size). The number of accesses that indicate a row hammer event can be somewhere in the range of 150K to 550K accesses during the time window. Such information is stored in a memory location (e.g., register) of the memory device and/or memory module.

The memory controller or detector can compute the maximum number of victim rows that are possible in the system, 504. The operations described below could be considered to be performed by the detector or the memory controller, depending on the implementation. For simplicity in description, the below description refers to operations by the detector, but will be understood as being able to be performed by either the detector, or the memory controller, or both, or that the detector can be part of the memory controller. The administrator could alternatively compute the maximum number of victim rows. The computation is based on determining what the maximum number of rows is that could be accessed the threshold number of times in the timeframe. As one simple example, consider a system in which the number of accesses that defines the threshold is 250K, and the timeframe is 64 ms. If each access takes somewhere on the order of 10 ns, then the maximum number of victim rows is approximated by 26 (64 ms/(250K*10 ns)=25.6). The maximum number of victims can be referred to as MVC (maximum victim count). It will be observed that this number of orders of magnitude smaller than the simple case of monitoring each row individually.

In one embodiment, the detector builds an array of entries based on the value of MVC, 506. The array can be a table or log or other structure. In one embodiment, the number of entries is at least MVC+1. The number of entries could be some multiple of MVC. In one embodiment, each entry of the table or log includes a row address accessible by CAM (content addressable memory) and an access count value. It will be understood that CAM allows access based on comparison of addresses. Other information could also be included in the entries.

In one embodiment, the detector initializes the array at the start of the timeframe, 508. The initialization can include a number of different operations. In one embodiment, on the start of a timeframe, the detector initializes each entry of the array to non-valid (e.g., by setting a flag or entering a value in the entry, or keeping a bitmap of valid entries separate from the array). In one embodiment, the detector resets the count value of each entry to zero.

In one embodiment, the detector can monitor each row by activation that identifies the row in the address fields of the Activate command (e.g., using CAM), 510. In one embodiment, the detector sorts the array by order of counter values (e.g., highest to lowest or lowest to highest). The sorting of the array can be accomplished by a sort, linked list, or other mechanism.

For every new activation of a row detected by the detector, 512, the detector can determine if the row is already in the array, 514. If the row is in the array, 514 YES branch, the detector increments the count for that entry, 516. There can be an additional requirement of having the entry also be valid (thus, increment if the row is in the array, and the entry is valid). There can be many ways of dealing with the situation where a row is not already in the array, 514 NO branch. In one embodiment, the detector determines if there are empty entries or invalid entries available in the array, 518.

If there is an available entry in the array, 518 YES branch, the detector fills the entry with the information associated with the row for which an activation was detected, 520. As needed for the specific implementation, the detector can also mark the entry as valid. The detector then increments the count for the entry, 516.

If there is not an available entry in the array, 518 NO branch, the detector can replace the entry with the lowest access count value with the row address of the row for which the activation was detected. 522. In one embodiment, the access count in the entry is specifically not reset or zeroed. Rather, the address information for the entry is replaced for the row that was just activated. It will be understood that certain rows in memory could be repeatedly accessed, but the repeated access could dither back and forth with access to another entry. Thus, by keeping the access count and incrementing it, it is almost certainly higher than the number of accesses for the row, but it will never be lower than the true number of accesses.

Thus, the detector keeps the previous access count value or row count, and increments it, 516. It will be understood that the simplest form of incrementing is by increasing the row count by 1 each time, but other forms of incrementing could be used. After incrementing, 516, the detector determines if the row count is at the maximum count, or whether the row has reached the threshold, 524. In one embodiment, the detector checks to see if the threshold is reached every time it detects a row activation, but other implementations are possible. In particular, for newly added entries, there may be no need to check the count against the threshold.

Regardless of the implementation, when the detector determines if the row is at the threshold, it can issue a targeted refresh command for the row to address the row hammer condition. If the row has not reached the threshold, 524 NO branch, the detector keeps monitoring, 510. If the row has reached the threshold, 524 YES branch, the detector indicates the address information of the row to the memory controller for the triggering of a targeted refresh command, 526. In one embodiment, when an entry reaches the threshold, the detector also resets the smallest count value of the entry to the smallest count value of any entry in the array. Again, such an action prevents the array from losing count information for an entry that is being repeatedly accessed, but at least initially is not being accessed as frequently as other rows. The detector can also clear the valid bit of the entry.

It will be understood that the operations described herein tend to "float up" the most frequently access rows. When implemented as described, there should not ever be a circumstance where there is a row whose actual access count is larger than the smallest access count of any entry in the array or list. Additionally, the risk of false alarms is limited due to the fact that the number of rows causing the target refresh cannot exceed the value of MVC.

Embodiments are described above with specific reference to the Figures. In general, it will be understood that various modifications of the system can be made. In one embodiment, row hammer detection logic is on the memory device itself. For example, the memory device can include detection logic in a device that handles the command and address information coming into the memory device. For example, a C/A (command/address) register or buffer or other comparable device on an RDIMM (register DIMM) or LRDIMM (load reduction DIMM). In one embodiment, the system performs distributed monitoring or distributed tracking via such a C/A device, or other distributed logic. The logic can use any method to monitor and/or track accesses to portions of the memory, such as what is described below with respect to FIG. 5, or any other method.

In one embodiment, the detection logic can be distributed across multiple logical portions of the memory device. Thus, even if all detection logic is executed in a C/A device, it can be considered distributed logic for purposes herein if it can monitor across different logical portions, each portion individually. The detection logic in the memory device alerts the memory controller when a row hammer event is detected. In one embodiment, the alert is triggered via a pulse width on an alert pin (e.g., ALERT#). In one embodiment, the memory device triggers the alert via setting the alert pin, and waiting for the memory controller to reset the alert pin. The memory controller can also poll the memory device in response to an alert to determine what alert is being indicated. In that way, multiple alerts could be generated on the same alert pin. Thus, for example, in current DDR DRAM designs, the host or the memory controller could differentiate between C/A parity error indication (asserted by a pulse width) and row hammer event indication if the row hammer event indication is indicated either as a setting of the pin, or if it pulses the pin and awaits a poll.

In one embodiment, the memory controller configures the memory device to detect row hammer events. For example, the memory controller can program the threshold values for what number of accesses triggers a row hammer event in a register control word. In one embodiment, the memory controller programs a time window for the memory device to determine row hammer conditions. For example, in some memory subsystems, a time window different than the refresh window could be used. In other subsystems, the refresh window could be programmable. If the threshold of number of accesses is reached in the given time window, the memory device (e.g., via a C/A register device) sends the alert signal to the host (e.g., to the memory controller).

When the memory controller receives an indication of a row hammer condition from the memory device, the memory controller triggers a targeted refresh in the memory device for a victim row for the row hammer condition. There are many alternatives to how the memory controller can trigger the targeted refresh. In one embodiment, the memory controller issues a row hammer refresh command to the memory device and indicates an address that triggered the row hammer condition. The memory controller can obtain the address from the C/A device in the memory device (e.g., via reading a control word). The memory controller can specify an exact address of the row that caused the row hammer condition and allow the memory device to resolve what row(s) are victim(s) (or physically adjacent). Alternatively, the memory controller could determine the specific victim row address. The memory controller can send an address that identifies a region of memory instead of the exact location of the row that triggered the row hammer condition.

In one embodiment, the memory controller issues a trigger to cause the memory device to generate a row hammer command. For example, the memory controller can write to a control bit in a C/A device, which can in turn generate a row hammer refresh command. Such a trigger would require less processing on the part of the memory controller, but more processing by the memory device. However, if the memory device has detected the row hammer event, it should have the address of the row that caused the row hammer event, and so could issue the command without having to exchange the address back and forth between the memory device and memory controller. In an alternative embodiment, the memory controller issues a row hammer refresh command (also referred to as a targeted refresh command) without including address information. The memory device (e.g., via the C/A device) can provide the address information and forward the command to the memory resources that will execute the targeted refresh.

It will be understood that reference to a C/A device is non-limiting. The distributed row hammer event management can be implemented in a C/A register of an RDIMM subsystem, a C/A register of an LRDIMM subsystem, a buffer of a buffer-on-boards (BoB) implementation, a logic buffer device in a 3DS (three-dimensional stacking) configuration, or some other device that handles command and address information.

As mentioned above, the memory controller can send a targeted refresh trigger that does or does not include address information. The address information can indicate what row is getting hammered, and thus not have to directly indicate the victim row (or the target of the targeted refresh command). In a typical refresh scenario, the memory device itself tracks what needs to be refreshed when. Thus, the memory device itself can calculate what victim row or rows will be affected by the row hammer event based on the memory layout used by the memory device. The memory device refreshes the victim row(s) by opening the row and then closing the row(s) to refresh.

It will be understood that for the memory controller to indicate an address of the hammered row to cause the memory device to refresh victim row(s) of the hammered row requires a certain number of bits to identify a specific address. In one embodiment, the memory controller identifies a specific address. In another embodiment, the memory controller identifies an area larger than a specific row. Thus, a memory controller can identify a specific block, a specific row, or an area, depending on the chosen configuration. The cost of identifying a very specific address is the number of bits required. The cost of identifying the address more generally is that the memory device needs to refresh a larger area, making the memory device unavailable for a longer refresh time.

In one embodiment, the memory controller indicates address information by sending address information to the memory device. In one embodiment, one or more additional pins or lines can be added between the memory controller and the memory device embeds address information into an existing command to identify address information. Thus, the targeted refresh command can be a modified existing command and/or a modified existing command in conjunction with the use of one or more additional pins or lines. In one embodiment, the targeted refresh command includes sending a command and address multiple times (e.g., three times). In one embodiment, the address can be modified in the successive commands (e.g., sending the address+1 and then the address−1 in two successive commands). Other embodiments are possible. In one embodiment, the memory controller sends a targeted refresh command, which the memory device separates into one or more groups of Activate and Precharge commands. Other commands could be doubled-up for targeted refresh purposes.

The theoretical maximum number of times a row can be accessed within a 64 ms window (e.g., a refresh window) is 1.35 million times (64 ms refresh window divided by 47 ns access time) for current DRAMs (dynamic random access memory). The practical maximum without risking data corruption in the victim rows is much lower, and depends on the process technology used. However, by detecting a row hammer event and sending a targeted refresh command, the risk of data corruption can be reduced without restricting access to a specific row of memory.

In a memory device, rows that are physically adjacent can often be logically labeled differently from one manufacturer to another. Typically a manufacturer maps logically adjacent rows of memory by a physical address offset, and the offsets can be different among different manufacturers. The memory device itself is configured to determine how to map access requests to the physical memory resources. Memory controllers are generally designed to be compatible with many different types of memory devices, and so they are generally not designed specifically with respect to any particular manufacturer's device. Thus, memory controllers do not traditionally have logic or information to indicate what rows are physically adjacent. With distributed detection logic, the memory devices themselves can undertake some of the operations related to identifying hammered rows and the victim row(s), as well one or more operations related to generating a targeted refresh command.

FIG. 6 is an embodiment of a command truth table supporting a targeted refresh command. Command truth table 600 represents one example of a truth table for a memory device. In accordance with table 600, one embodiment of sending a targeted refresh trigger is for the memory controller to issues a targeted refresh command (row hammer command identified as command 630). In an alternative embodiment, a different mechanism is used to trigger the memory device to perform a targeted refresh. The column to the left identifies supported functions. The columns to the right identify the value of different signals to specify the identified functions.

Of particular note in table 600 for purposes of discussion here is command 630, which is Row Hammer command. In one embodiment, prior to setting command 630 on a C/A bus to the memory device, the memory controller places the memory device in a 'row hammer mode' via a Mode Register (MR) bit or bits. In one embodiment, the memory controller provides row address along with bank group and bank address to the memory device. The memory device performs a targeted refresh using the address provided to the physical row adjacent to the address. After allowing a period of time for the refresh command to occur, the memory controller can then remove the memory device from 'row hammer mode' by resetting the MR bit(s). Thus, when the MR bit is set by the memory controller, the memory device understands command 630 as a Row Hammer command, which could otherwise be understood as a Bank Activate command.

In one embodiment, Row Hammer is identical to Bank Activate (the command above it), with the exception of the value of signal 610, ACT_n. Thus, in one embodiment, the Row Hammer command is triggered by ACT_n, which is a pin or signal not in previous memory standards. The signal on ACT_n can indicate whether or not the command is Row Hammer or Bank Activate. It is shown as active-low, but could alternatively be configured to be active-high. Both commands can identify an address, as indicated by the row address bits.

It will be observed that the three columns labeled as 620 include RAS, CAS and WE signals. However, these commands can be controlled internally by the memory device itself. Thus, by multiplexing these signals with additional address information (address bits A16, A15, and A14, respectively), enables more address information to be provided to more particularly identify the address of the target of the row hammer condition.

When ACT is set (e.g., column 620), the memory device reads RAS/CAS/WE as row address information. When ACT is not set, the memory device reads RAS/CAS/WE as traditional memory access encoding. As mentioned above, the address information could be identified for block, specific row, or some other size area. The refresh can be as specific or as wide as desired for the system.

While the Activate command is shown as being doubled up by the use of signal ACT_n, Refresh or any other command could be used. Alternatively, a completely new command could be used for targeted refresh. As illustrated, the targeted refresh command can be said to be embedded in an Activate command. The memory device identifies the victim row based on the address inside row hammer command 630.

Figure 7:
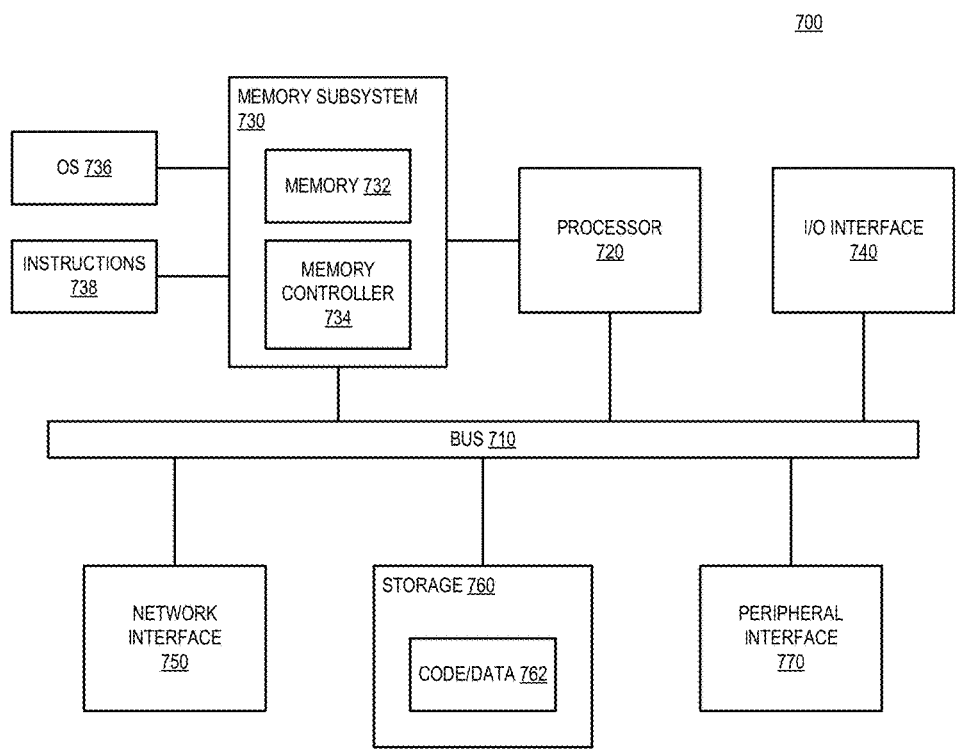
FIG. 7 is a block diagram of an embodiment of a computing system in which row hammer monitoring can be implemented.

FIG. 7 is a block diagram of an embodiment of a computing system in which row hammer monitoring can be implemented. System 700 represents a computing device in accordance with any embodiment described herein, and can be a laptop computer, a desktop computer, a server, a gaming or entertainment control system, a scanner, copier, printer, or other electronic device. System 700 includes processor 720, which provides processing, operation management, and execution of instructions for system 700. Processor 720 can include any type of microprocessor, central processing unit (CPU), processing core, or other processing hardware to provide processing for system 700. Processor 720 controls the overall operation of system 700, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 730 represents the main memory of system 700, and provides temporary storage for code to be executed by processor 720, or data values to be used in executing a routine. Memory subsystem 730 can include one or more memory devices such as read-only memory (ROM), flash memory, one or more varieties of random access memory (RAM), or other memory devices, or a combination of such devices. Memory subsystem 730 stores and hosts, among other things, operating system (OS) 736 to provide a software platform for execution of instructions in system 700. Additionally, other instructions 738 are stored and executed from memory subsystem 730 to provide the logic and the processing of system 700. OS 736 and instructions 738 are executed by processor 720.

Memory subsystem 730 includes memory device 732 where it stores data, instructions, programs, or other items. In one embodiment, memory subsystem includes memory controller 734, which is a memory controller in accordance with any embodiment described herein, and which provides a targeted refresh command to memory device 732 based on a row hammer condition. A row hammer condition can be detected based on a threshold stored for the memory device, in accordance with any embodiment described herein. The targeted refresh command causes memory device 732 to perform a targeted refresh, which is a refresh operation off-cycle, meaning it is not on the regularly scheduled cycle of refreshes, and is not necessarily on an area tracked by the memory device as the next area to refresh. Rather, the region refreshed is based on a victim row or region identified based on an address associated with the targeted refresh command(s). Memory controller 734 can trigger a targeted refresh in memory 732 in response to detection by distributed detection logic in accordance with any embodiment described herein.

Processor 720 and memory subsystem 730 are coupled to bus/bus system 710. Bus 710 is an abstraction that represents any one or more separate physical buses, communication lines/interfaces, and/or point-to-point connections, connected by appropriate bridges, adapters, and/or controllers. Therefore, bus 710 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 710 can also correspond to interfaces in network interface 750.

System 700 also includes one or more input/output (I/O) interface(s) 740, network interface 750, one or more internal mass storage device(s) 760, and peripheral interface 770 coupled to bus 710. I/O interface 740 can include one or more interface components through which a user interacts with system 700 (e.g., video, audio, and/or alphanumeric interfacing). Network interface 750 provides system 700 the ability to communicate with remote devices (e.g., servers, other computing devices) over one or more networks. Network interface 750 can include an Ethernet adapter, wireless interconnection components, USB (universal serial bus), or other wired or wireless standards-based or proprietary interfaces.

Storage 760 can be or include any conventional medium for storing large amounts of data in a nonvolatile manner, such as one or more magnetic, solid state, or optical based disks, or a combination. Storage 760 holds code or instructions and data 762 in a persistent state (i.e., the value is retained despite interruption of power to system 700). Storage 760 can be generically considered to be a "memory," although memory 730 is the executing or operating memory to provide instructions to processor 720. Whereas storage 760 is nonvolatile, memory 730 can include volatile memory (i.e., the value or state of the data is indeterminate if power is interrupted to system 700).

Peripheral interface 770 can include any hardware interface not specifically mentioned above. Peripherals refer generally to devices that connect dependently to system 700. A dependent connection is one where system 700 provides the software and/or hardware platform on which operation executes, and with which a user interacts.

Figure 8:
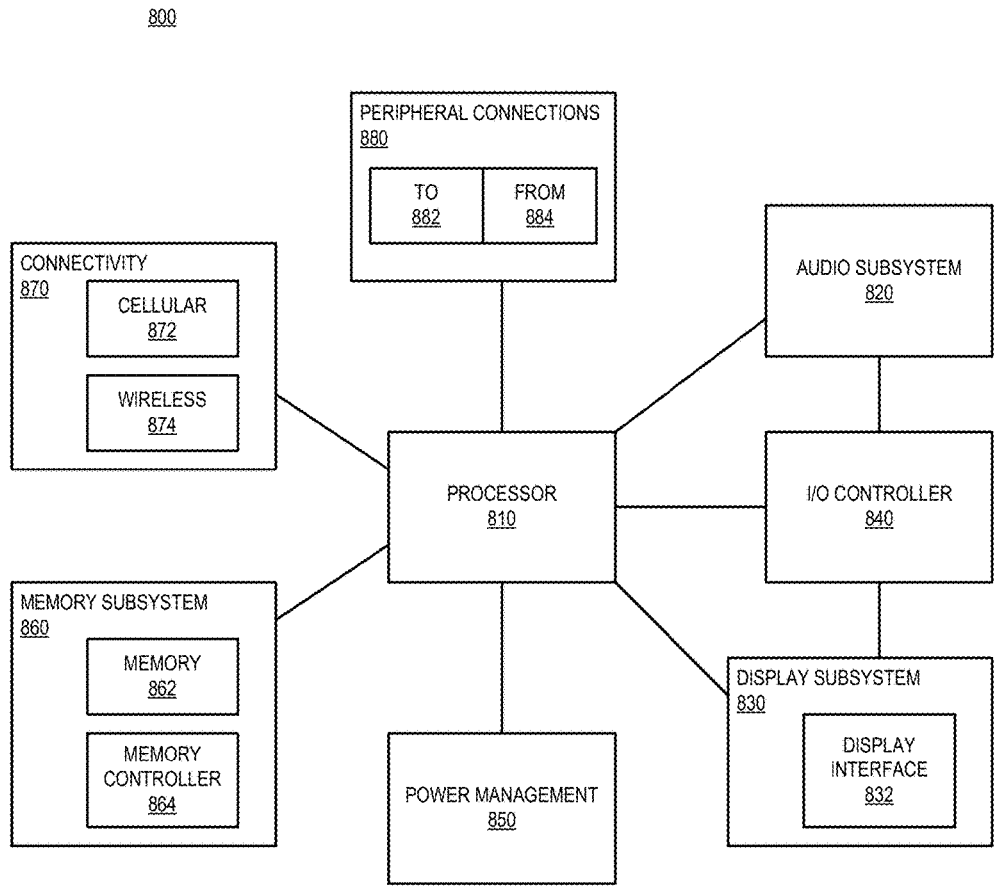
FIG. 8 is a block diagram of an embodiment of a mobile device in which row hammer monitoring can be implemented.

FIG. 8 is a block diagram of an embodiment of a mobile device in which row hammer monitoring can be implemented. Device 800 represents a mobile computing device, such as a computing tablet, a mobile phone or smartphone, a wireless-enabled e-reader, or other mobile device. It will be understood that certain of the components are shown generally, and not all components of such a device are shown in device 800.

Device 800 includes processor 810, which performs the primary processing operations of device 800. Processor 810 can include one or more physical devices, such as microprocessors, application processors, microcontrollers, programmable logic devices, or other processing means. In one embodiment, processor 810 includes optical interface components in addition to a processor die. Thus, the processor die and photonic components are in the same package. Such a processor package can interface optically with an optical connector in accordance with any embodiment described herein.

The processing operations performed by processor 810 include the execution of an operating platform or operating system on which applications and/or device functions are executed. The processing operations include operations related to I/O (input/output) with a human user or with other devices, operations related to power management, and/or operations related to connecting device 800 to another device. The processing operations can also include operations related to audio I/O and/or display I/O.

In one embodiment, device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 800, or connected to device 800. In one embodiment, a user interacts with device 800 by providing audio commands that are received and processed by processor 810.

Display subsystem 830 represents hardware (e.g., display devices) and software (e.g., drivers) components that provide a visual and/or tactile display for a user to interact with the computing device. Display subsystem 830 includes display interface 832, which includes the particular screen or hardware device used to provide a display to a user. In one embodiment, display interface 832 includes logic separate from processor 810 to perform at least some processing related to the display. In one embodiment, display subsystem 830 includes a touchscreen device that provides both output and input to a user.

I/O controller 840 represents hardware devices and software components related to interaction with a user. I/O controller 840 can operate to manage hardware that is part of audio subsystem 820 and/or display subsystem 830. Additionally, I/O controller 840 illustrates a connection point for additional devices that connect to device 800 through which a user might interact with the system. For example, devices that can be attached to device 800 might include microphone devices, speaker or stereo systems, video systems or other display device, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of device 800. Additionally, audio output can be provided instead of or in addition to display output. In another example, if display subsystem includes a touchscreen, the display device also acts as an input device, which can be at least partially managed by I/O controller 840. There can also be additional buttons or switches on device 800 to provide I/O functions managed by I/O controller 840.

In one embodiment, I/O controller 840 manages devices such as accelerometers, cameras, light sensors or other environmental sensors, gyroscopes, global positioning system (GPS), or other hardware that can be included in device 800. The input can be part of direct user interaction, as well as providing environmental input to the system to influence its operations (such as filtering for noise, adjusting displays for brightness detection, applying a flash for a camera, or other features).

In one embodiment, device 800 includes power management 850 that manages battery power usage, charging of the battery, and features related to power saving operation. Memory subsystem 860 includes memory device(s) 862 for storing information in device 800. Memory subsystem 860 can include nonvolatile (state does not change if power to the memory device is interrupted) and/or volatile (state is indeterminate if power to the memory device is interrupted) memory devices. Memory 860 can store application data, user data, music, photos, documents, or other data, as well as system data (whether long-term or temporary) related to the execution of the applications and functions of system 800.

In one embodiment, memory subsystem 860 includes memory controller 864 (which could also be considered part of the control of system 800, and could potentially be considered part of processor 810). Memory controller 864 issues a targeted refresh command based on a row hammer condition at a specific row of memory of memory device 862. Memory controller 864 can detect the row hammer condition based on a threshold stored for the memory device, in accordance with any embodiment described herein. Memory controller 864 can trigger a targeted refresh in memory 832 in response to detection by distributed detection logic in accordance with any embodiment described herein.

Connectivity 870 includes hardware devices (e.g., wireless and/or wired connectors and communication hardware) and software components (e.g., drivers, protocol stacks) to enable device 800 to communicate with external devices. The device could be separate devices, such as other computing devices, wireless access points or base stations, as well as peripherals such as headsets, printers, or other devices.

Connectivity 870 can include multiple different types of connectivity. To generalize, device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 874 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that device 800 could both be a peripheral device ("to" 882) to other computing devices, as well as have peripheral devices ("from" 884) connected to it. Device 800 commonly has a "docking" connector to connect to other computing devices for purposes such as managing (e.g., downloading and/or uploading, changing, synchronizing) content on device 800. Additionally, a docking connector can allow device 800 to connect to certain peripherals that allow device 800 to control content output, for example, to audiovisual or other systems.

In addition to a proprietary docking connector or other proprietary connection hardware, device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

FIG. 9 depicts a table containing mode register values/ DDR4 MPR3 settings to support TRR mode including tMAC, according to an embodiment. In an embodiment, A7, A6, A5 and A4 define/store Don't care settings in the mode register. In an embodiment, A3, A2, A1 and A0 define/store tMAC settings in the mode register. In an embodiment, the mode register may store the tMAC for a SDRAM device. In an embodiment, a DDR4 SDRAM's row of memory may comprise a limited number of times a given row can be accessed within a certain time period prior to requiring adjacent memory rows to be refreshed. The tMAC comprises the maximum number of activates that a single row can sustain within a time interval of equal to or less than the Maximum Activate Window (tMAW) before the adjacent rows need to be refreshed regardless of how the activates are distributed over tMAW. The row receiving the excessive actives is the Target Row (TRn). When the tMAC limit is reached on TRn, either the SDRAM must receive roundup (tMAW/REFI) Refresh Commands (REF) before another row activate is issued, or the DDR4 SDRAM should be placed into Targeted Row Refresh (TRR) mode, in an embodiment. The TRR Mode will refresh the rows adjacent to the TRn that encountered tMAC limit, in an embodiment.

In an embodiment, a memory controller may be coupled to the SDRAM device, wherein the memory controller may include detection logic capable of obtaining the tMAC from the mode register, and capable of monitoring the number of activates within a maximum activate window (tMAW) for the one or more rows of the SDRAM device. The memory controller may further include command and control logic to issue an activate command (ACT) to initiate a target row refresh (TRR) mode if tMAC is exceeded.

FIG. 10 depicts a table containing mode register entries for DDR4 MPR tMAC decode values, according to an embodiment. In an embodiment, decode values for various tMAC ranges are listed. In other embodiments, the particular decode values may vary depending upon the memory type and manufacturer, etc. In an embodiment, the tMAC decode values comprise threshold values for a particular SDRAM device. In another embodiment, the tMAC decode values include threshold values for at least one memory device that is different from the particular SDRAM device.

Figure 11:
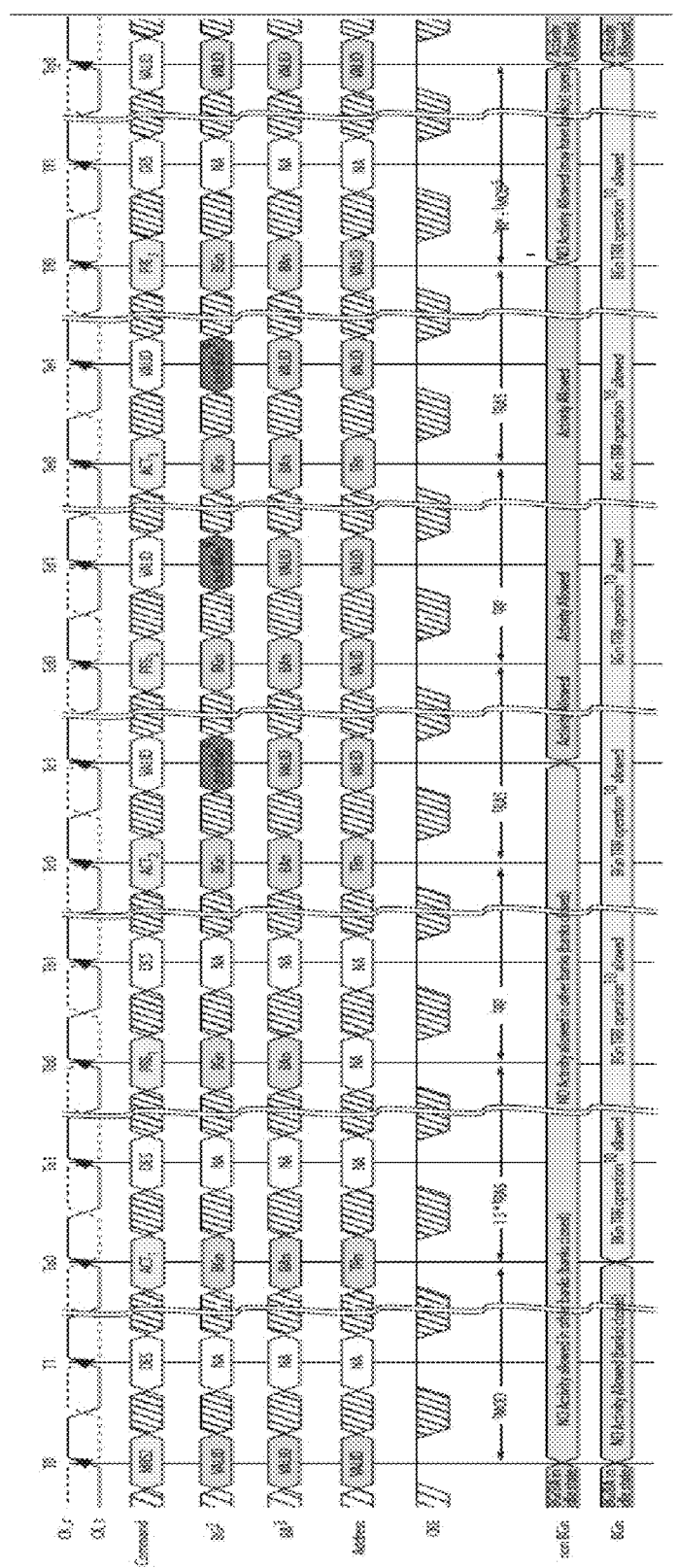
FIG. 11 is a timing diagram for targeted row refresh (TRR) according to an embodiment.

FIG. 11 shows a timing diagram for a TRR mode operation according to an embodiment. TRn is the targeted row, Bgn represents the bank group in which the targeted row is located, and BAn represents the bank in which the targeted row is located. In an embodiment, the following steps must be performed when TRR mode is enabled. First, this mode requires all three Activate commands (ACT1, ACT2 and ACT3) and three corresponding precharge (PRE commands (PRE1, PRE2 and PRE3) to complete TRR mode. A Precharge All (PREA) commands issued while DDR4 SDRAM is in TRR mode will also perform precharge to BGn and counts towards a PREn command. Second, prior to issuing the MRS command to enter TRR mode, the SDRAM should be in the idle state. A MRS command must be issued with MR2 [A13=1], MR2[A8,A2] containing the targeted bank group and MR2 [A1,A0] defining the bank in which the targeted row is located. All other MR2 bits should remain unchanged. N Third, no activity is to occur in the DRAM until tMOD has been satisfied. Once tMOD has been satisfied, the only commands to BGn allowed are ACT and PRE until the TRR mode has been completed. Fourth, the first ACT to the BGn with the TRn address can now be applied, no other command is allowed at this point. All other bank groups must remain inactive from when the first BGn ACT command is issued until [(1.5*tRAS)+tRP] is satisfied.

Fifth, after the first ACT to the BGn with the TRn address is issued, a PRE to BGn is to be issued (1.5*tRAS) later; and then followed tRP later by the second ACT to the BGn with the TRn address. Once the 2nd activate to the BGn is issued, nonBGn bank groups are allowed to have activity. Sixth, after the second ACT to the BGn with the TRn address is issued, a PRE to BGn is to be issued tRAS later and then followed tRP later by the third ACT to the BGn with the TRn address. Seventh, after the third ACT to the BGn with the TRn address is issued, a PRE to BGn would be issued tRAS later; and once the third PRE has been issued, nonBGn bank groups are not allowed to have activity until TRR mode is exited. The TRR mode is completed once tRP plus tMOD is satisfied. Eighth, TRR mode must be completed as specified to guarantee that adjacent rows are refreshed. Anytime the TRR mode is interrupted and not completed, such as the DRAM receiving a Parity error during TRR mode, the interrupted TRR Mode must be cleared and then subsequently performed again.

To clear an interrupted TRR mode, an MR2 change is required with setting MR2 [A13=0], MR2 [A8,A2:A0] are don't care, followed by three PRE to BGn, tRP time in between each PRE command. When a Parity error occurs in TRR Mode, the SDRAM may self-clear MR2 [A13=0]. The complete TRR sequence (Steps 2-7) must be then re-issued and completed to guarantee that the adjacent rows are refreshed. Ninth, refresh command to the DDR4 SDRAM or entering Self-Refresh mode is not allowed while the DRAM is in TRR mode. In an embodiment, TRR mode self-clears after tMOD+tRP measured from the 3rd BGn precharge PRE3 at clock edge Tg0. In an embodiment, TRR mode or any other activity can be re-engaged after tMOd+tRP from 3rd Bgn Pre3. PRE_ALL also counts if issued instead of PREn. TRR mode is cleared by DRAM after PRE3 to the BGn bank.

In an embodiment, the ACT commands to BGn during TRR mode do not provide refreshing support. In other words, the Refresh counter is unaffected. In an embodiment, the DRAM must restore store the degraded row(s) caused by excessive activation of the targeted row (TRn) necessary to meet refresh requirements. In an embodiment, a new TRR mode must wait tMOD+tRP time after the third precharge. In an embodiment, BGn must not be used with another command, ACT and PRE are the only allowed commands to BGn during TRR mode, and refresh commands are not allowed during TRR mode. In an embodiment, all DRAM timings are met by DRAM during TRR mode such as tFAW and issuing of ACT1, ACT2, and ACT3 counts towards tFAW budget.

In one aspect, a memory subsystem includes a memory device having multiple physical rows of memory cells; and row hammer detection logic coupled to the memory device, the detection logic to obtain an access rate threshold for the memory device from a register that stores configuration information for the memory device, the threshold identifying a number of accesses to a specific row of memory within a time window that causes risk of data corruption on a row physically adjacent to the accessed row; determine based on the threshold whether a number of accesses to one of the multiple physical rows of the memory device exceeds the threshold; and in response to detecting that the number of accesses exceeds the threshold, trigger the memory device to perform a refresh targeted to a victim row physically adjacent to the row for which the number of accesses exceeded the threshold.

In one embodiment, the row hammer detection logic comprises detection logic of a memory controller coupled to the memory device. In one embodiment, the row hammer detection logic comprises distributed detection logic of the memory device. In one embodiment, the register that stores configuration information for the memory device comprises a configuration storage device of a memory module of which the memory device is a part. In one embodiment, the register that stores configuration information for the memory device comprises a configuration register on the memory device. In one embodiment, the detection logic is to obtain a three-bit code that indicates the threshold.

In one embodiment, the threshold for the memory device is a first threshold, and is different from a second threshold for a different memory device in the memory subsystem. In one embodiment, the detection logic monitors each memory device in accordance with its different threshold. In one embodiment, the detection logic is to further determine which threshold is lower; and monitor the memory devices in accordance with the lower threshold.

In one aspect, an electronic device includes a memory subsystem having a memory device having multiple physical rows of memory cells; and row hammer detection logic coupled to the memory device, the detection logic to obtain an access rate threshold for the memory device from a register that stores configuration information for the memory device, the threshold identifying a number of accesses to a specific row of memory within a time window that causes risk of data corruption on a row physically adjacent to the accessed row; determine based on the threshold whether a number of accesses to one of the multiple physical rows of the memory device exceeds the threshold; and in response to detecting that the number of accesses exceeds the threshold, trigger the memory device to perform a refresh targeted to a victim row physically adjacent to the row for which the number of accesses exceeded the threshold; and a touch-screen display device configured to provide a user display based on data accessed from the memory device.

In one embodiment, the register that stores configuration information for the memory device comprises a configuration storage device of a memory module of which the memory device is a part. In one embodiment, the register that stores configuration information for the memory device comprises a configuration register on the memory device. In one embodiment, the threshold for the memory device is a first threshold, and is different from a second threshold for a different memory device in the memory subsystem. In one embodiment, the detection logic monitors each memory device in accordance with its different threshold. In one embodiment, the detection logic is to further determine which threshold is lower; and monitor the memory devices in accordance with the lower threshold. In one embodiment, the detection logic is to obtain a field of a configuration register that stores a code indicating the threshold.

In one aspect, a method includes obtaining an access rate threshold for a memory device from a register that stores configuration information for the memory device, the threshold identifying a number of accesses to a specific row of memory within a time window that causes risk of data corruption on a row physically adjacent to the accessed row; determining based on the threshold whether a number of accesses to one of the multiple physical rows of the memory device exceeds the threshold; and in response to detecting that the number of accesses exceeds the threshold, generating a trigger to cause the memory device to perform a refresh targeted to a victim row physically adjacent to the row for which the number of accesses exceeded the threshold.

In one embodiment, generating the trigger comprises sending an alert from distributed detection logic at the memory device to a memory controller to cause the memory controller to issue a targeted refresh command to the memory device. In one embodiment, determining whether the number of access exceeds the threshold further comprises: monitoring accesses to rows of the memory device for the time window; determining if a number of accesses for any of the rows exceeds the threshold; and indicating address information for a row determined to exceed the number of accesses in the time window. In one embodiment, the threshold for the memory device is a first threshold, different from a second threshold for a different memory device sharing a memory subsystem with the memory device, and wherein determining based on the threshold further comprises: determining whether the first or second threshold is lower; and monitoring both memory devices based on the determined lower threshold.

Flow diagrams as illustrated herein provide examples of sequences of various process actions. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device comprising:
    a memory array including a target row and at least one row physically adjacent to the target row;
    a register to store a value to indicate a maximum number of accesses to the target row within a time period; and
    a detector to detect when a number of accesses to the target row meets or exceeds the maximum number;
    wherein the memory device is to perform a refresh of the row physically adjacent to the target row in response to the number of accesses to meet or exceed the maximum number.

2. The memory device of claim 1, wherein the at least one row physically adjacent to the target row comprises two victim rows, both to be refreshed in response to the number of accesses to meet or exceed the maximum number.

3. The memory device of claim 1, wherein the register comprises a dynamic random access memory (DRAM) device mode register to store the value.

4. The memory device of claim 1, wherein the value comprises an address of an entry in a lookup table of maximum numbers.

5. The memory device of claim 1, wherein the memory device is to perform the refresh in response to a refresh command from an associated memory controller.

6. The memory device of claim 1, wherein the memory device is to perform the refresh in response to an activate command from an associated memory controller.

7. The memory device of claim 1, wherein the detector is to maintain a table of access counts to rows having a highest number of accesses.

8. A system comprising:
    a memory controller to send memory access commands; and
    a synchronous dynamic random access memory (SDRAM) device including:
        a memory array including a target row and at least one row physically adjacent to the target row, wherein the memory access commands include commands to the target row;
        a register to store a value to indicate a maximum number of accesses to the target row within a time period; and
        a detector to detect when a number of accesses to the target row meets or exceeds the maximum number;
        wherein the memory device is to perform a refresh of the row physically adjacent to the target row in response to the number of accesses to meet or exceed the maximum number.

9. The system of claim 8, wherein the at least one row physically adjacent to the target row comprises two victim rows, both to be refreshed in response to the number of accesses to meet or exceed the maximum number.

10. The system of claim 8, wherein the register comprises a mode register to store the value.

11. The system of claim 8, wherein the value comprises an address of an entry in a lookup table of maximum numbers.

12. The system of claim 8, wherein the SDRAM device is to perform the refresh in response to a refresh command from the memory controller.

13. The system of claim 8, wherein the SDRAM device is to perform the refresh in response to an activate command from the memory controller.

14. The system of claim 8, wherein the detector is to maintain a table of access counts to rows having a highest number of accesses.

15. The system of claim 8, further comprising one or more of:
- a multicore processor coupled to the memory controller;
- a network interface coupled to SDRAM device; and
- a display device configured to provide a user display based on data accessed from the SDRAM device.

16. A method comprising:
- accessing, from a register of a memory device, a maximum number that indicates a maximum number of accesses to a target row of the memory device within a time period;
- detecting with a detector at the memory device when a number of accesses to a target row meets or exceeds the maximum number; and
- performing a refresh of a row physically adjacent to the target row in response to the number of accesses meeting or exceeding the maximum number.

17. The method of claim 16, wherein accessing the maximum number comprises accessing one of multiple maximum numbers from a lookup table.

18. The method of claim 16, wherein performing the refresh comprises performing the refresh in response to receipt of a refresh command from an associated memory controller.

19. The method of claim 16, wherein performing the refresh comprises performing the refresh in response to receipt of an activate command from an associated memory controller.

20. The method of claim 16, further comprising:
- maintaining a table of access counts to rows having a highest number of accesses.

* * * * *